United States Patent
Daibou et al.

(10) Patent No.: US 10,103,199 B2
(45) Date of Patent: Oct. 16, 2018

(54) MAGNETIC MEMORY

(71) Applicant: Kabushiki Kaisha Toshiba, Minato-ku (JP)

(72) Inventors: Tadaomi Daibou, Yokohama (JP); Naoharu Shimomura, Meguro (JP); Yuuzo Kamiguchi, Yokohama (JP); Hiroaki Yoda, Kawasaki (JP); Yuichi Ohsawa, Yokohama (JP); Tomoaki Inokuchi, Yokohama (JP); Satoshi Shirotori, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/421,053

(22) Filed: Jan. 31, 2017

(65) Prior Publication Data

US 2017/0141158 A1    May 18, 2017

Related U.S. Application Data

(63) Continuation of application No. 15/263,852, filed on Sep. 13, 2016.

(30) Foreign Application Priority Data

Sep. 15, 2015    (JP) .................................. 2015-182079

(51) Int. Cl.
*G11C 5/06* (2006.01)
*G11C 11/15* (2006.01)
(Continued)

(52) U.S. Cl.
CPC .......... *H01L 27/228* (2013.01); *G11C 11/161* (2013.01); *G11C 11/1673* (2013.01);
(Continued)

(58) Field of Classification Search
CPC ....... H01L 27/228; H01L 43/02; H01L 43/08; H01L 43/10; G11C 11/161; G11C 11/1673; G11C 11/1675; G11C 5/06
(Continued)

(56) References Cited

U.S. PATENT DOCUMENTS 6,845,038 B1 * 1/2005 Shukh ..................... G11C 11/14
                                                            365/164
7,145,795 B2   12/2006 Ghodsi
(Continued)

FOREIGN PATENT DOCUMENTS

| JP | 2012-190530 A | 10/2012 |
| JP | 2014-045196 A | 3/2014 |
| WO | WO2009/110532 A1 | 9/2009 |

OTHER PUBLICATIONS

Ki-Seung Lee et al., Thermally activated switching of perpendicular magnet by spin-orbit spin torque, Applied Physics Letters 104, 072413 (2014).

*Primary Examiner* — Ly D Pham
(74) *Attorney, Agent, or Firm* — Oblon, McClelland, Maier & Neustadt, L.L.P.

(57) ABSTRACT

A magnetic memory according to an embodiment includes: a conductive nonmagnetic layer including a first terminal, a second terminal, and a region between the first terminal and the second terminal; a magnetoresistive element including: a first magnetic layer; a second magnetic layer disposed between the region and the first magnetic layer; and a nonmagnetic intermediate layer disposed between the first magnetic layer and the second magnetic layer; a transistor including a third terminal, a fourth terminal, and a control terminal, the third terminal being electrically connected to the first terminal; a first wiring electrically connected to the first magnetic layer and the fourth terminal; a second wiring
(Continued)

electrically connected to the control terminal; and a third wiring electrically connected to the second terminal.

12 Claims, 10 Drawing Sheets

(51) Int. Cl.
| | |
|---|---|
| *G11C 11/02* | (2006.01) |
| *G11C 5/02* | (2006.01) |
| *H01L 27/22* | (2006.01) |
| *H01L 43/02* | (2006.01) |
| *H01L 43/08* | (2006.01) |
| *G11C 11/16* | (2006.01) |
| *H01L 43/10* | (2006.01) |

(52) U.S. Cl.
CPC .......... *G11C 11/1675* (2013.01); *H01L 43/02* (2013.01); *H01L 43/08* (2013.01); *H01L 43/10* (2013.01); *G11C 5/06* (2013.01)

(58) Field of Classification Search
USPC .................. 365/66, 158, 189.15, 189.16
See application file for complete search history.

(56) References Cited

U.S. PATENT DOCUMENTS

| | | | |
|---|---|---|---|
| 8,139,325 B2* | 3/2012 | Tsunekawa ............ | B82Y 10/00 360/324.2 |
| 9,076,537 B2 | 7/2015 | Khvalkovskiy et al. | |
| 9,318,179 B2* | 4/2016 | Huai ........................ | G11C 11/15 |
| 2002/0141232 A1* | 10/2002 | Saito ........................ | G11C 11/15 365/158 |
| 2004/0021189 A1* | 2/2004 | Yoda ........................ | B82Y 10/00 257/421 |
| 2005/0057960 A1* | 3/2005 | Saito ........................ | G11C 11/16 365/154 |
| 2006/0060901 A1* | 3/2006 | Nakamura ............... | G11C 11/16 257/295 |
| 2008/0061388 A1* | 3/2008 | Diao ........................ | G11C 11/16 257/421 |
| 2008/0239930 A1* | 10/2008 | Saito ........................ | B82Y 10/00 369/126 |
| 2009/0218645 A1* | 9/2009 | Ranjan .................... | G11C 11/16 257/421 |
| 2011/0002163 A1 | 1/2011 | Fukami et al. | |
| 2011/0062537 A1* | 3/2011 | Oh ........................... | B82Y 25/00 257/421 |
| 2011/0163743 A1* | 7/2011 | Rodmacq ................ | B82Y 25/00 324/244.1 |
| 2013/0077389 A1* | 3/2013 | Kitagawa ................ | G11C 11/16 365/158 |
| 2014/0169088 A1* | 6/2014 | Buhrman ................. | G11C 11/18 365/158 |
| 2015/0102439 A1* | 4/2015 | Gan ......................... | H01F 10/3286 257/421 |
| 2015/0171315 A1* | 6/2015 | Gan ......................... | H01F 10/3286 257/421 |
| 2015/0200003 A1* | 7/2015 | Buhrman ................. | G11C 11/18 365/158 |
| 2015/0263273 A1* | 9/2015 | Yoshikawa ............. | H01L 43/08 257/295 |
| 2015/0340598 A1* | 11/2015 | Gan ......................... | H01L 43/08 257/421 |
| 2016/0276006 A1* | 9/2016 | Ralph ...................... | G11C 11/18 |

* cited by examiner

US 10,103,199 B2

MAGNETIC MEMORY

CROSS REFERENCE TO RELATED APPLICATIONS

The present application is a continuation of U.S. patent application Ser. No. 15/263,852, filed on Sep. 13, 2016, which claims priority to Japanese patent application JP 2015-182079, filed on Sep. 15, 2015.

FIELD

Embodiments described herein relate generally to magnetic memories.

BACKGROUND

A magnetic memory (hereinafter also referred to as a magnetoresistive random access memory (MRAM)) is a nonvolatile memory capable of high-speed operation. Therefore, MRAMs are expected to serve as novel nonvolatile work memories, and are being developed by numerous organizations. An MRAM includes a magnetic tunnel junction (MTJ) element as a storage element. This MTJ element includes a first magnetic layer having a fixed magnetization direction (this magnetic layer is also referred to as the reference layer), a second magnetic layer having a variable magnetization direction (this magnetic layer is also referred to as the storage layer), and a nonmagnetic insulating layer disposed between the first magnetic layer and the second magnetic layer.

Writing into the MTJ element is performed by switching the magnetization direction of the storage layer. One of the known techniques for such writing is spin transfer torque magnetization switching (hereinafter also referred to as spin transfer torque (STT)). By this technique, current is applied from the storage layer to the reference layer, or from the reference layer to the storage layer, via the nonmagnetic insulating layer. In this manner, the magnetization direction of the storage layer is switched.

In writing by this STT, current is applied to the nonmagnetic insulating layer. As a result, the nonmagnetic insulating layer might be broken at a time of writing. Since current is also applied to the nonmagnetic insulating layer at a time of data reading, read disturb might occur, as the magnetization direction of the storage layer is switched by STT at a time of data reading.

Another one of the known techniques for writing is a technique using a spin Hall effect or a spin-orbit interaction. A spin-orbit interaction is a phenomenon in which current is applied to a nonmagnetic layer so that electrons having spin angular momenta (hereinafter also referred to simply as the spin) of the opposite orientations from each other are scattered in the opposite directions, and a spin current Is is generated. At this point, the spin s, the spin current Is, and the electron current Ie (of the opposite direction from the current) satisfy the relationship:

$$Is \propto s \times Ie$$

That is, the spin current Is is proportional to the cross product of the spin s and the electron current Ie. As an MTJ element is stacked on the nonmagnetic layer, spin torque (spin orbit torque (SOT)) is applied to the storage layer of the MTJ element by virtue of the spin current generated in the nonmagnetic layer, and the magnetization direction of the storage layer can be switched. An MRAM that performs writing by using this principle is called an SOT-MRAM.

An SOT cell that is a memory cell used in an SOT-MRAM has a three-terminal element in its fundamental configuration. Since a read current path and a write current path are different, two or three transistors are provided for one SOT cell. Therefore, the cell area becomes larger.

Further, there is a reported technique by which MTJ elements and one transistor are stacked on one nonmagnetic layer, for example. To perform writing on a certain cell according to this technique, current needs to be applied in the in-plane direction to the nonmagnetic layer while spin torque is applied to the MTJ elements by applying current in a direction perpendicular to the stacking direction of the MTJ elements. Because of this, controlling the write current value becomes more difficult. Furthermore, since MTJ elements are integrated on one nonmagnetic layer, the nonmagnetic layer inevitably becomes longer, and the possibility of electromigration might become higher.

DETAILED DESCRIPTION

A magnetic memory according to an embodiment includes: a conductive nonmagnetic layer including a first terminal, a second terminal, and a region between the first terminal and the second terminal; a magnetoresistive element including: a first magnetic layer; a second magnetic layer disposed between the region and the first magnetic layer; and a nonmagnetic intermediate layer disposed between the first magnetic layer and the second magnetic layer; a transistor including a third terminal, a fourth terminal, and a control terminal, the third terminal being electrically connected to the first terminal; a first wiring electrically connected to the first magnetic layer and the fourth terminal; a second wiring electrically connected to the control terminal; and a third wiring electrically connected to the second terminal.

The following is a description of embodiments of the present invention, with reference to the accompanying drawings.

First Embodiment

Figure 1A:
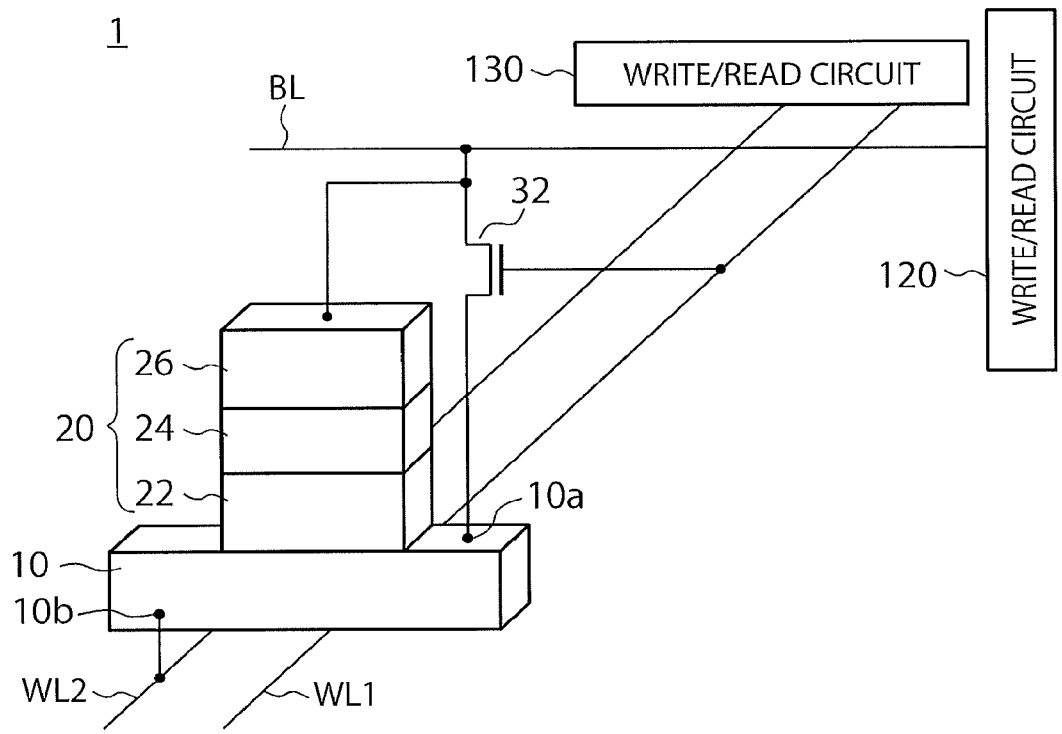
FIG. 1A is a perspective view of a memory cell according to a first embodiment.

Referring to FIG. 1A, a magnetic memory according to a first embodiment is described. The magnetic memory of the first embodiment includes at least one memory cell, and this memory cell is shown in FIG. 1A. The memory cell 1 of the first embodiment includes a nonmagnetic layer 10, a magnetoresistive element 20 formed on the nonmagnetic layer 10, and a select transistor 32.

The magnetoresistive element 20 has a stack structure formed by stacking a magnetic layer 22, a nonmagnetic intermediate layer 24, and a magnetic layer 26 in this order. Specifically, the nonmagnetic intermediate layer 24 is formed between the nonmagnetic layer 10 and the magnetic layer 26, and the magnetic layer 22 is formed between the nonmagnetic layer 10 and the nonmagnetic intermediate layer 24. The magnetic layer 22 has a changeable magnetization direction, and the magnetic layer 26 has a fixed magnetization direction. Here, a changeable magnetization direction means a magnetization direction that can be changeable at a time before and after a write operation described later. A fixed magnetization direction means a magnetization direction that does not change at a time before and after the write operation. The magnetoresistive element 20 is a magnetoresistive element having a resistance Rmtj that is sufficiently higher than the on-resistance Rtr of the transistor. Here, the resistance Rmtj indicates the resistance at a time when the magnetization directions of the magnetic layer 22 and the magnetic layer 26 are in a parallel state in the magnetoresistive element 20. For example, the resistance ratio between the transistor and the magnetoresistive element can be approximately 1:10. Since one tenth or so of the write current may flow into the magnetoresistive element, the resistance Rmtj is ten or more times higher than the on-resistance Rtr.

The nonmagnetic layer 10 includes a first terminal 10a and a second terminal 10b in two regions that have the magnetoresistive element 20 interposed therebetween. In FIG. 1A, the second terminal 10b is formed on a side surface of the nonmagnetic layer 10, but is preferably formed on the lower surface on the opposite side from the upper surface on which the magnetoresistive element 20 is disposed. Also, the second terminal 10b may be formed on the lower surface and in a region immediately below the magnetoresistive element 20. As will be apparent from the write operation described later, the magnetoresistive element 20 should be located in the path of the current flowing between the first terminal 10a and the second terminal 10b.

One of the source and the drain of the select transistor 32 is electrically connected to the magnetic layer 26 and a bit line BL. The other one of the source and the drain of the select transistor 32 is connected to the first terminal 10a of the nonmagnetic layer 10. The gate of the select transistor 32 is connected to a word line WL1. The second terminal 10b of the nonmagnetic layer 10 is connected to a word line WL2.

Figure 2:
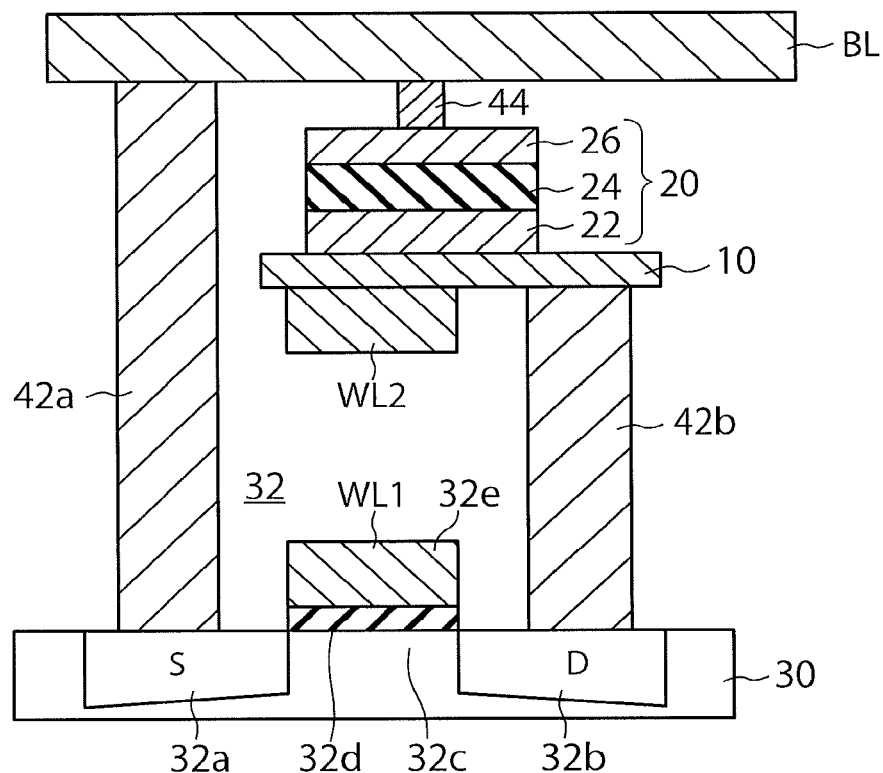
FIG. 2 is a cross-sectional view of a memory cell according to the first embodiment.

FIG. 2 is a cross-sectional view of a specific example of the memory cell 1 designed as above.

The select transistor 32 is formed on a semiconductor layer 30. This select transistor 32 includes a source 32a and a drain 32b formed at a distance from each other in the semiconductor layer 30, a gate insulating film 32d disposed on a channel 32c located between the source 32a and the drain 32b, and a gate electrode 32e that is formed on the gate insulating film 32d and serves as the word line WL1.

A source electrode 42a extending upward is formed on the source 32a, and a drain electrode 42b extending upward is formed on the drain 32b. The source electrode 42a is connected to the bit line BL, and the magnetic layer 26 of the memory cell 1 is connected to this bit line BL via an electrode 44. The nonmagnetic layer 10 of the memory cell 1 is connected to the drain electrode 42b, and is also connected to the word line WL2. The word line WL2 is located above the word line WL1 and runs parallel to the word line WL1.

Referring to FIGS. 1A and 2, a write operation and a read operation of the memory cell 1 of this embodiment are next described.

(Write Operation)

Figure 3:
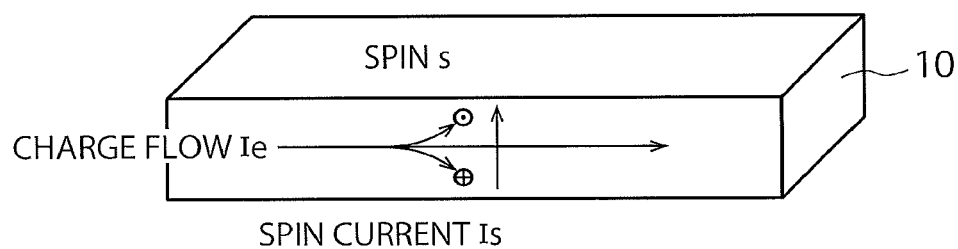
FIG. 3 is a diagram for explaining a spin-orbit interaction.

A write operation is performed by applying current between the first terminal and the second terminal of the nonmagnetic layer 10. For example, as shown in FIG. 3, when an electron current is applied to the nonmagnetic layer 10 from left to right in the drawing, electrons of one type (up-spin electrons, for example) among up-spin electrons and down-spin electrons flow into the upper surface of the nonmagnetic layer 10, and electrons of the other type (down-spin electrons, for example) flow into the lower surface of the nonmagnetic layer 10 by a spin-orbit interaction. That is, electrons spin-polarized in one of the orientations of up-spin and down-spin flow into the upper surface of the nonmagnetic layer 10 from left to right in the drawing, and electrons spin-polarized in the other orientation flow into the lower surface of the nonmagnetic layer 10. As a result, the spin torque from the electrons that are spin-polarized in the one orientation and flow in the upper surface of the nonmagnetic layer 10 affects the magnetization of the magnetic layer 22, so that the magnetization direction of the magnetic layer 22 can be reversed. The nonmagnetic layer 10 is a layer serving to cause a spin-orbit interaction. When an electron current is applied to the nonmagnetic layer 10 from right to left in the drawing, for example, down-spin electrons flow into the upper surface of the nonmagnetic layer 10, and up-spin electrons flow into the lower surface of the nonmagnetic layer 10, which is the opposite of the above described case. In this manner, the magnetization direction of the magnetic layer 22 can be switched in accordance with the directions of the currents flowing in the nonmagnetic layer 10.

To cause a write operation in a memory cell of this embodiment, a write/read circuit 130 first turns on the select transistor 32 of the memory cell on which writing is to be performed. The write/read circuit 130 adjusts the voltage to be applied to the gate electrode 32e of the select transistor 32 via the word line WL1, so that the select transistor 32 can be put into an on-state. In this state, a write/read circuit 120 applies current from the bit line BL to the word line WL2 via the first terminal 10a and the second terminal 10b of the nonmagnetic layer 10. The paths in which current flows include: a first path that extends from the bit line BL to the nonmagnetic layer 10 via the source electrode 42a, the source 32a, the channel 32c, the drain 32b, and the drain electrode 42b, and leads to the word line WL2; and a second path that extends from the bit line BL, the magnetoresistive element 20, and the nonmagnetic layer 10, and leads to the word line WL2.

In this embodiment, when the select transistor 32 is in an on-state, the resistance Rmtj of the magnetoresistive element 20 is sufficiently higher than the on-resistance Rtr of the select transistor 32. Therefore, most current flows in the first path that extends from the bit line BL to the nonmagnetic layer 10 via the source electrode 42a, the source 32a, the channel 32c, the drain 32b, and the drain electrode 42b, and leads to the word line WL2. In the first path, current flows in the in-plane direction of the nonmagnetic layer 10. As a result, the effect of a spin-orbit interaction appears, and magnetic torque is applied to the magnetic layer 22. Consequently, the magnetization direction of the magnetic layer 22 is switched, and a write operation is performed.

Since the select transistor 32 and the magnetoresistive element 20 are arranged parallel to each other, a high voltage is applied to the magnetoresistive element 20. Therefore, there is a risk of the nonmagnetic intermediate layer 24 of the magnetoresistive element 20 being broken. However, the breakdown voltage of the nonmagnetic intermediate layer 24 of the magnetoresistive element 20 can be made higher by increasing the thickness of the nonmagnetic intermediate layer 24 of the magnetoresistive element 20 so as to satisfy the condition that the resistance Rmtj of the magnetoresistive element 20 is sufficiently higher than the on-resistance Rtr of the select transistor 32. Thus, the nonmagnetic intermediate layer 24 can be prevented from breaking.

(Read Operation)

To perform a read operation, the select transistor 32 is first turned off. The select transistor 32 can be turned off by the write/read circuit 130 adjusting the voltage to be applied to the gate electrode 32e of the select transistor 32 via the word line WL1. In this state, the write/read circuits 120 and 130 apply a read current from the bit line BL to the word line WL2.

The paths in which current flows when the select transistor 32 is in an off-state include: a first path that extends from the bit line BL to the nonmagnetic layer 10 via the source electrode 42a, the source 32a, the channel 32c, the drain 32b, and the drain electrode 42b, and leads to the word line WL2; and a second path that extends from the bit line BL and leads to the word line WL2 via the electrode 44, the magnetoresistive element 20, and the nonmagnetic layer 10. The resistance of the select transistor 32 in an off-state is in an electrically insulated state, and therefore, most current flows in the second path that leads to the word line WL2 via the bit line BL, the electrode 44, the magnetoresistive element 20, and the nonmagnetic layer 10. In the second path, current flows in a direction parallel to the stacking direction of the magnetoresistive element 20. Thus, the resistance value of the magnetoresistive element 20 can be read.

In the memory cell structure of this embodiment, reading and writing can be performed with a single select transistor. Where the size of the gate of the select transistor 32 is represented by F (minimum feature size), the length of the nonmagnetic layer 10 can be reduced to approximately 2F, as can be seen from FIG. 2, and the probability of breaking due to electromigration can be lowered.

Figure 1B:
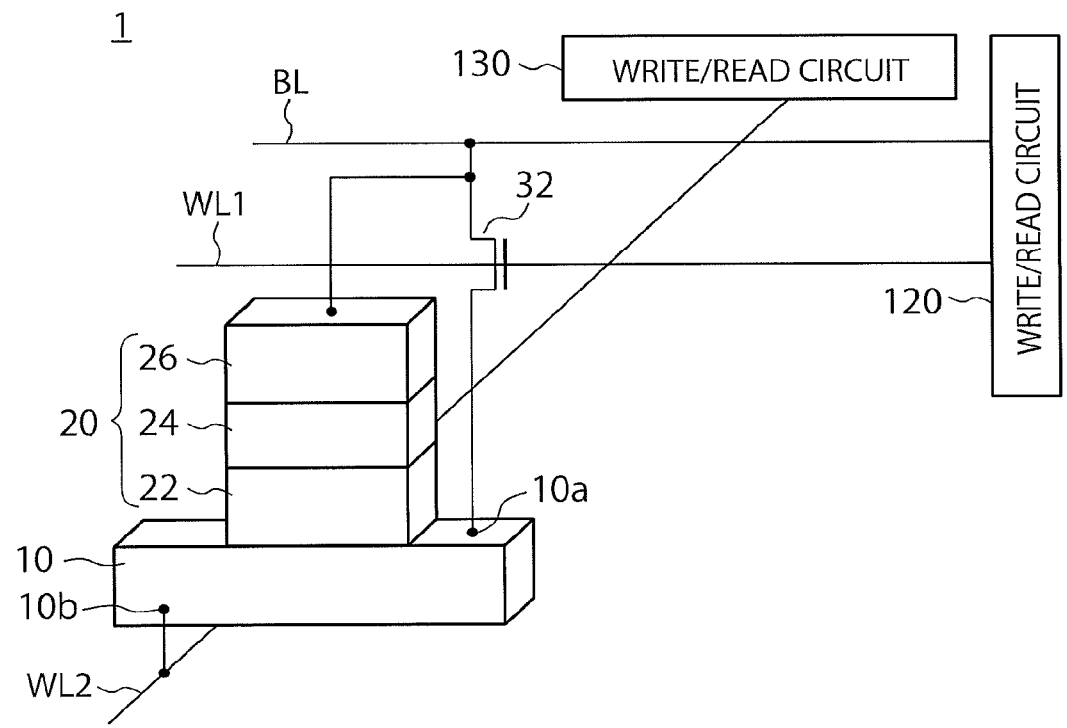
FIG. 1B is a perspective view of a memory cell according to a modification of the first embodiment.

In FIG. 1A, the gate of the select transistor 32 is connected to the word line WL1 connected to the write/read circuit 130. However, the gate of the select transistor 32 may be connected to the word line WL1 connected to the write/read circuit 120, as in a modification of the first embodiment shown in FIG. 1B. In this case, switching on and off of the select transistor 32 is controlled by the write/read circuit 120.

As described above, in a magnetic memory of this embodiment, a write operation and a read operation can be performed with a simple cell configuration.

Second Embodiment

In a case where memory cells 1 of the first embodiment are integrated, two or more memory cells are electrically connected via each wiring line. As a result, leakage current (also called sneak current) is generated via these wiring lines, and defects occur in write operations and read operations. The influence of this leakage current is now described, with reference to an example read operation in a cell array shown in FIG. 4.

This cell array includes four memory cells $1_{11}$ through $1_{22}$, two bit lines $BL_1$ and $BL_2$, and four word lines $WL1_1$, $WL2_1$, $WL1_2$, and $WL2_2$. Each memory cell $1_{ij}$ (i, j=1, 2) includes a nonmagnetic layer $10_{ij}$, a magnetoresistive element $20_{ij}$ disposed on one of the two facing surfaces of the nonmagnetic layer $10_{ij}$, and a select transistor $32_{ij}$. Each magnetoresistive element $20_{ij}$ (i, j=1, 2) includes a magnetic layer $22_{ij}$ formed on the one of the surfaces, a nonmagnetic intermediate layer $24_{ij}$ formed on the magnetic layer $22_{ij}$, and a magnetic layer $26_{ij}$ formed on the nonmagnetic intermediate layer $24_{ij}$.

In each memory cell $1_{ij}$ (i, j=1, 2), the magnetic layer $26_{ij}$ and one of the source and the drain of the select transistor $32_{ij}$ are connected to the bit line $BL_i$, the other one of the source and the drain of the select transistor $32_{ij}$ is connected to the first terminal $10a_{ij}$ of the nonmagnetic layer $10_{ij}$, the gate of the select transistor $32_{ij}$ is connected to the word line $WL1_j$, and the second terminal $10b_{ij}$ of the nonmagnetic layer $10_{ij}$ is connected to the word line $WL2_j$.

An example case where data is read from the memory cell $1_{11}$ of such a cell array is now described.

First, all the select transistors $32_{ij}$ (i, j=1, 2) are switched off.

Voltage is then applied to the bit line $BL_1$ and the word line $WL2_1$ connected to the memory cell $1_{11}$. The select transistor $32_{ij}$ in an off-state is in an electrically insulated state, and therefore, most current flows in the path that leads to the word line $WL2_1$ via the bit line $BL_1$, the magnetoresistive element $20_{11}$, and the nonmagnetic layer $10_{11}$. The current $I_{11}$ flowing in this path flows as a sense current in a direction parallel to the stacking direction of the magnetoresistive element $20_{11}$. Thus, the resistance value of the magnetoresistive element $20_{11}$ can be read.

Furthermore, the memory cell $1_{12}$, the memory cell $1_{21}$, and the memory cell $1_{22}$ are electrically connected to the memory cell $1_{11}$. Therefore, leakage current $I_{12}$ flows from the bit line $BL_1$ into the magnetoresistive element $20_{12}$ in the memory cell $1_{12}$. This leakage current $I_{12}$ generates leakage current $I_{22}$ that flows in the magnetoresistive element $20_{12}$ in the memory cell $1_{22}$ via the word line $WL2_2$. This leakage current $I_{22}$ generates leakage current $I_{21}$ that flows in the magnetoresistive element $20_{21}$ in the memory cell $1_{21}$ via the bit line $BL_2$. This leakage current $I_{21}$ eventually flows into the word line $WL2_1$.

As leakage current flows through the different memory cells $1_{12}$, $1_{22}$, and $1_{21}$ adjacent to the memory cell $1_{11}$, the resistances of the magnetoresistive elements $20_{12}$, $20_{22}$, and $20_{21}$ are superimposed as modulation components of the read resistance of the memory cell $1_{11}$. Consequently, the readout accuracy of the memory cells is degraded.

To reduce the leakage current and increase the readout accuracy, diodes are preferably provided in the respective memory cells in a magnetic memory. For example, diodes using a polysilicon PN junction or diodes using the Schottky effect can be employed. A magnetic memory including memory cells with such a configuration is now described as a second embodiment.

Figure 5:
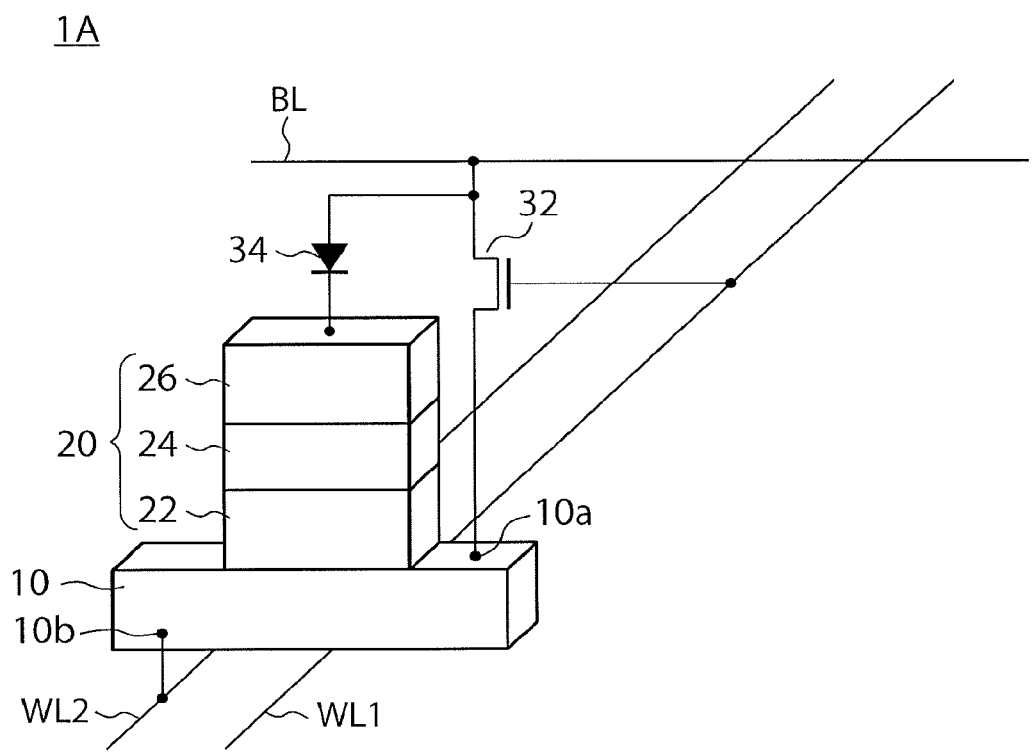
FIG. 5 is a perspective view of a memory cell according to a second embodiment.

The magnetic memory of the second embodiment includes at least one memory cell, and this memory cell is shown in FIG. 5. The memory cell 1A of the second embodiment includes a nonmagnetic layer 10, a magnetoresistive element 20 formed on the nonmagnetic layer 10, a select transistor 32, and a diode 34. That is, the memory cell 1A of the second embodiment is the same as the memory cell 1 of the first embodiment shown in FIG. 1A or of the modification shown in FIG. 1B, except for further including the diode 34 that has an anode connected to the bit line BL and has a cathode connected to the magnetic layer 26 of the magnetoresistive element 20.

Figure 4:
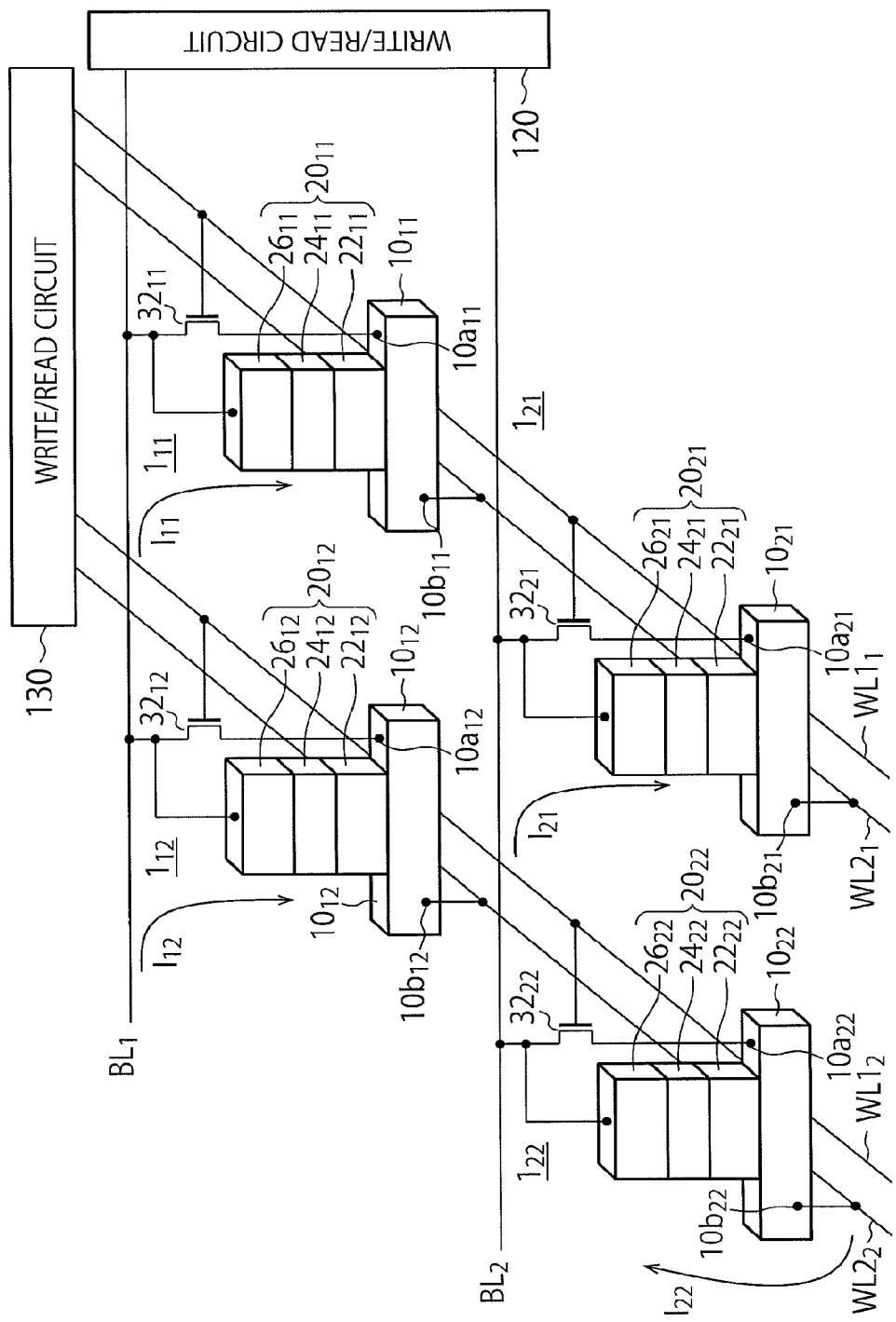
FIG. 4 is a diagram for explaining a magnetic memory in which memory cells of the first embodiment are arranged in an array.

With such a configuration, the leakage current $I_{22}$ shown in FIG. 4 can be prevented from flowing into the bit line $BL_2$ when data is read from the memory cell $1_{11}$, and thus, leakage current can be prevented from flowing into the word line $WL2_1$. In this manner, the readout accuracy of the memory cells can be prevented from becoming lower.

In the second embodiment, the bit line BL is connected to a write/read circuit 120, and the word lines WL1 and WL2 are connected to a write/read circuit 130, as in the first embodiment shown in FIG. 1A. Alternatively, the bit line BL and the word line WL1 may be connected to the write/read circuit 120, and the word line WL2 may be connected to the write/read circuit 130, as in the modification of the first embodiment shown in FIG. 1B.

In the second embodiment, a write operation and a read operation can be performed with a simple cell configuration, as in the first embodiment.

(Reductions in Cell Size)

Next, reductions in the area occupied by the memory cells of the first and second embodiments are described.

A memory cell that uses a spin Hall effect or a spin-orbit interaction is normally an element with three terminals. In this memory cell, the current path for reading and the current path for writing are different. Therefore, two or three transistors are connected to one memory cell.

As a result, the memory cell area becomes larger.

In the first and second embodiments, however, write operations and read operations can be controlled by using one transistor for one memory cell. Thus, the area occupied by the memory cells can be reduced.

(First Example Layout)

Figure 6A:
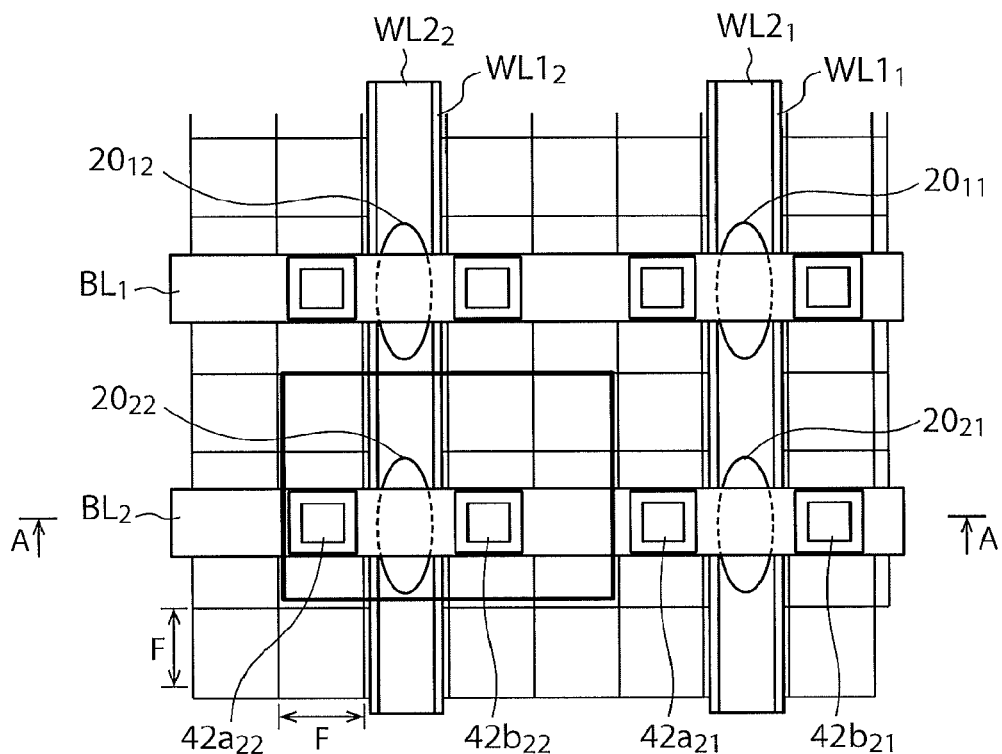
FIG. 6A is a diagram showing a first example of a layout of memory cells of the first embodiment.
Figure 6B:
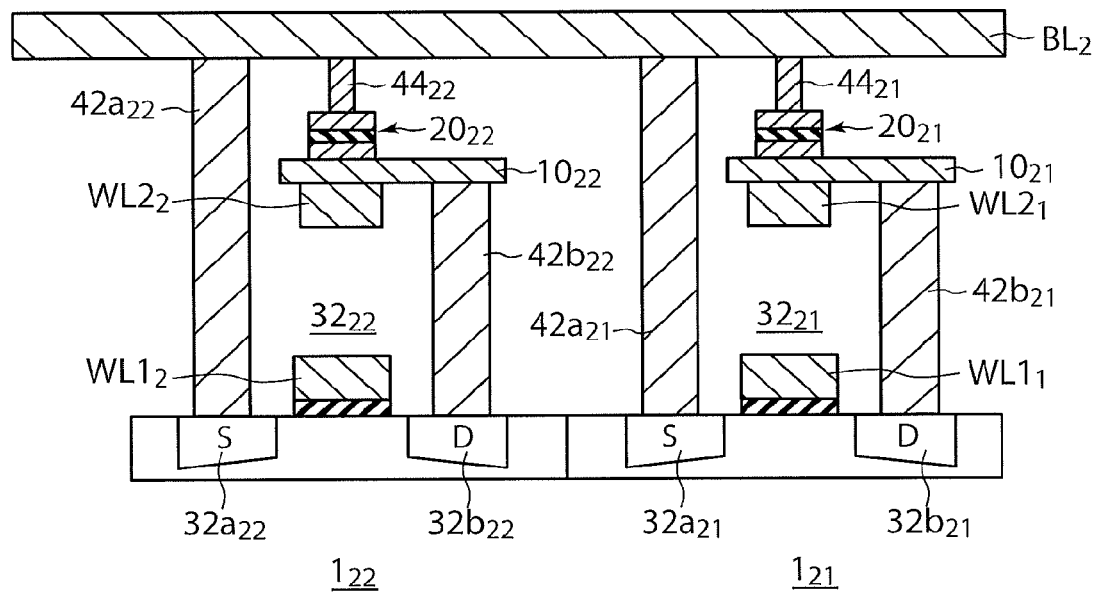
FIG. 6B is a cross-sectional view taken along the section line A-A defined in FIG. 6A.

FIG. 6A shows a first example of a layout in which memory cells 1 of the first embodiment are arranged in a 2×2 array. FIG. 6B shows a cross-section taken along the section line A-A defined in FIG. 6A. Each word line $WL1_j$ (j=1, 2) and each word line $WL2_j$ are arranged parallel to each other, and each bit line $BL_i$ (i=1, 2) is arranged perpendicularly to these word lines.

Each memory cell $1_{ij}$ (i, j=1, 2) has the same structure as that of the memory cell shown in FIG. 2, and includes a nonmagnetic layer $10_{ij}$, a magnetoresistive element $20_{ij}$, a select transistor $32_{ij}$, a source electrode $42a_{ij}$, a drain electrode $42b_{ij}$, and an electrode $44_{ij}$. The source electrode $42a_{ij}$ (i, j=1, 2) and the drain electrode $42b_{ij}$ extend from the source $32a_{ij}$ and the drain $32b_{ij}$ of the select transistor $32_{ij}$ to the bit line $BL_j$ and the nonmagnetic layer $10_{ij}$, respectively. The electrode $44_{ij}$ (i, j=1, 2) is connected to the magnetoresistive element $20_{ij}$ and the bit line $BL_i$.

In a case where the two magnetic layers forming the magnetoresistive element $20_{ij}$ (i, j=1, 2) have a magnetization direction perpendicular to the stacking direction of the magnetoresistive element $20_{ij}$, the width (gate width) of one of the planar shapes of the magnetic layers forming the magnetoresistive element $20_{ij}$ is set at F, and the width of the other one is increased to 2F, to exhibit shape anisotropy. Here, F is the minimum working size. In the first example, the size of the magnetic layers in the longitudinal direction is 2F.

In the first example, as can be seen from FIG. 6A, the intervals between the adjacent memory cells are set at F both in the longitudinal direction and in the transverse direction. Because of this, each memory cell $1_{ij}$ (i, j=1, 2) is 3F in the size in the longitudinal direction in FIG. 6A, and is 4F in the size in the transverse direction. Accordingly, the area occupied by the memory cells is $3\times4F^2$.

(Second Example Layout)

Figure 7A:
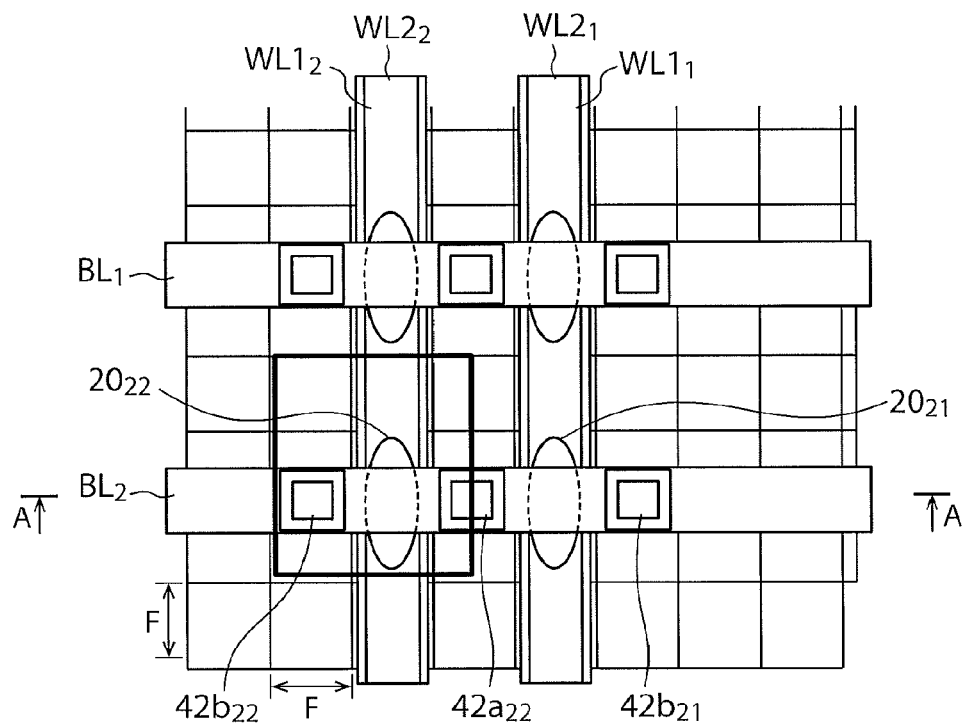
FIG. 7A is a diagram showing a second example of a layout of memory cells of the first embodiment.
Figure 7B:
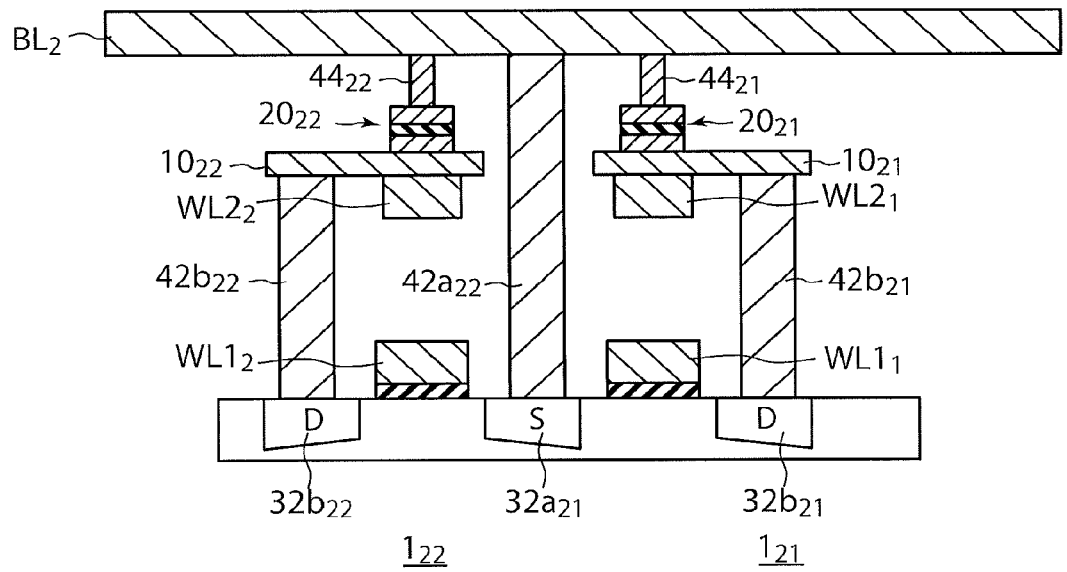
FIG. 7B is a cross-sectional view taken along the section line A-A defined in FIG. 7A.

FIG. 7A shows a second example of a layout in which memory cells 1 of the first embodiment are arranged in a 2×2 array. FIG. 7B shows a cross-section taken along the section line A-A defined in FIG. 7A. Each word line $WL1_j$ (j=1, 2) and each word line $WL2_j$ are arranged parallel to each other, and each bit line $BL_i$ (i=1, 2) is arranged perpendicularly to these word lines.

Each memory cell $1_{ij}$ (i, j=1, 2) has the same structure as that of the memory cell shown in FIG. 2, and includes a nonmagnetic layer $10_{ij}$, a magnetoresistive element $20_{ij}$, a select transistor $32_{ij}$, a source electrode $42a_{ij}$, a drain electrode $42b_{ij}$, and an electrode $44_{ij}$. However, the second example differs from the first example in that memory cells adjacent to each other in the transverse direction, such as the memory cell $1_{22}$ and the memory cell $1_{21}$, have the source $32a_{21}$ shared between the select transistors $32_{22}$ and $32_{21}$, and share a source electrode that is the source electrode $42a_{21}$.

In the second example, to provide each magnetoresistive element with shape anisotropy, the width (gate width) of one of the planar shapes of the magnetic layers forming the magnetoresistive element $20_{ij}$ is set at F, and the width of the other one is increased to 2F, as in the first example. In the second example, the size of the magnetic layers in the longitudinal direction is 2F.

As can be seen from FIG. 7A, in the second example, the size of each memory cell $1_{ij}$ (i, j=1, 2) in the longitudinal direction is 3F, as in the first example. In the second example, however, each two memory cells adjacent to each other in the transverse direction share a source and a source electrode. Because of this, the size of each memory cell in the transverse direction is 2.5F. Accordingly, the area occupied by the memory cells is $3\times2.5F^2$ in the second example.

(Third Example Layout)

Figure 8A:
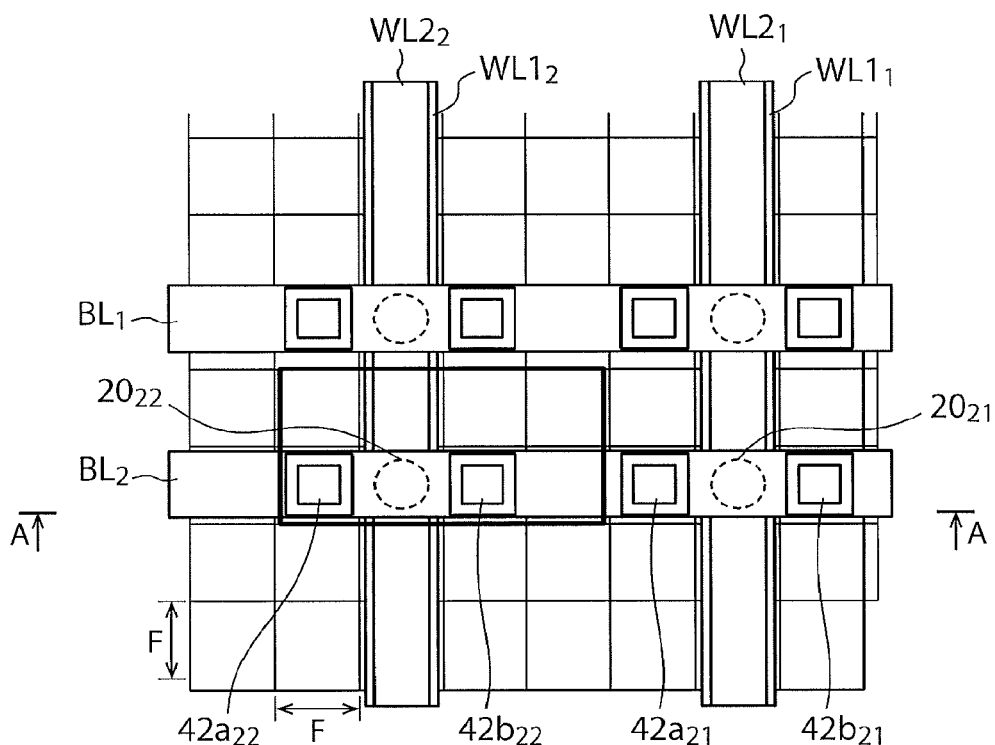
FIG. 8A is a diagram showing a third example of a layout of memory cells of the first embodiment.
Figure 8B:
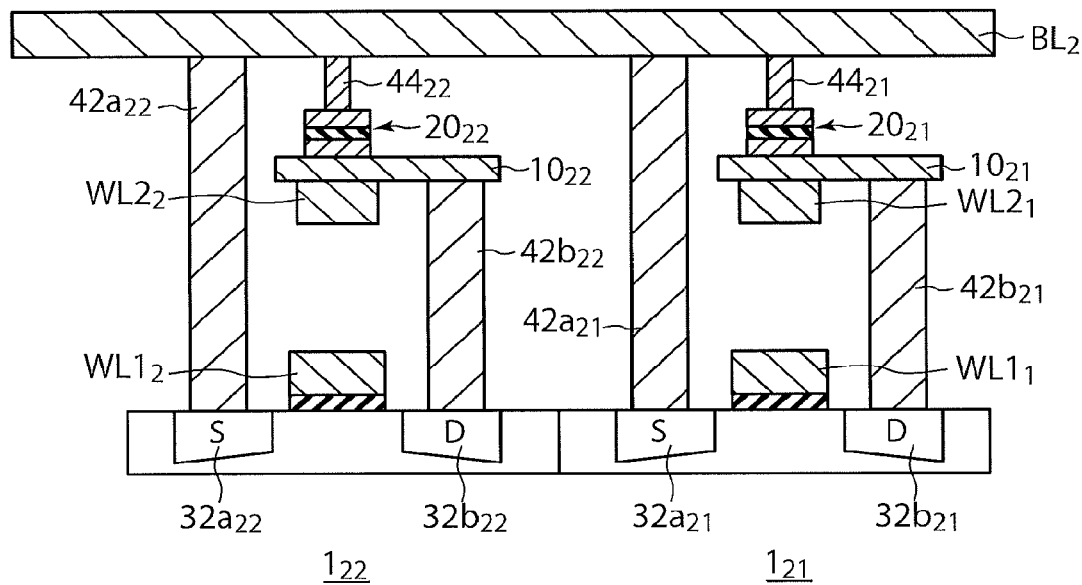
FIG. 8B is a cross-sectional view taken along the section line A-A defined in FIG. 8A.

FIG. 8A shows a third example of a layout in which memory cells 1 of the first embodiment are arranged in a 2×2 array. FIG. 8B shows a cross-section taken along the section line A-A defined in FIG. 8A. Each word line $WL1_j$ (j=1, 2) and each word line $WL2_j$ are arranged parallel to each other, and each bit line $BL_i$ (i=1, 2) is arranged perpendicularly to these word lines.

Each memory cell $1_{ij}$ (i, j=1, 2) has the same structure as that of the memory cell shown in FIG. 2, and includes a nonmagnetic layer $10_{ij}$, a magnetoresistive element $20_{ij}$, a select transistor $32_{ij}$, a source electrode $42a_{ij}$, a drain electrode $42b_{ij}$, and an electrode $44_{ij}$. The source electrode $42a_{ij}$ (i, j=1, 2) and the drain electrode $42b_{ij}$ extend from the source $32a_{ij}$ and the drain $32b_{ij}$ of the select transistor $32_{ij}$ to the bit line $BL_j$ and the nonmagnetic layer $10_{ij}$, respectively. The electrode $44_{ij}$ (i, j=1, 2) is connected to the magnetoresistive element $20_{ij}$ and the bit line $BL_i$.

In the third example, each magnetoresistive element $20_{ij}$ (i, j=1, 2) is circular in planar shape. Accordingly, the area occupied by each magnetoresistive element $20_{ij}$ (i, j=1, 2) is $1\times1F^2$. The gate width is assumed to be F as the minimum pitch width, and the intervals between adjacent memory cells are set at F both in the longitudinal direction and in the transverse direction. As can be seen from FIG. 8A, in this case, each memory cell is 2F in the size in the longitudinal direction, and is 4F in the size in the transverse direction. Accordingly, the area occupied by the memory cells is $2\times4F^2$ in the third example.

In the case where each magnetoresistive element $20_{ij}$ (i, j=1, 2) is circular in planar shape, both of the magnetic layers 22 and are preferably made of a magnetic material having a magnetization direction parallel to the stacking direction of the magnetoresistive element $20_{ij}$.

(Fourth Example Layout)

Figure 9A:
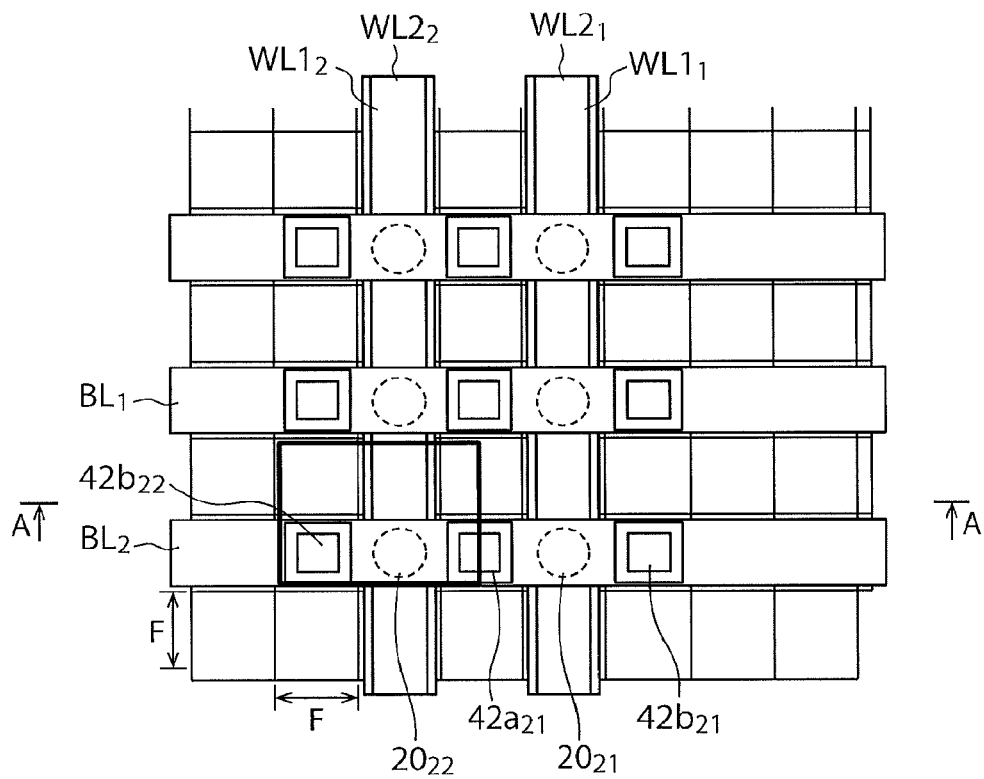
FIG. 9A is a diagram showing a fourth example of a layout of memory cells of the first embodiment.
Figure 9B:
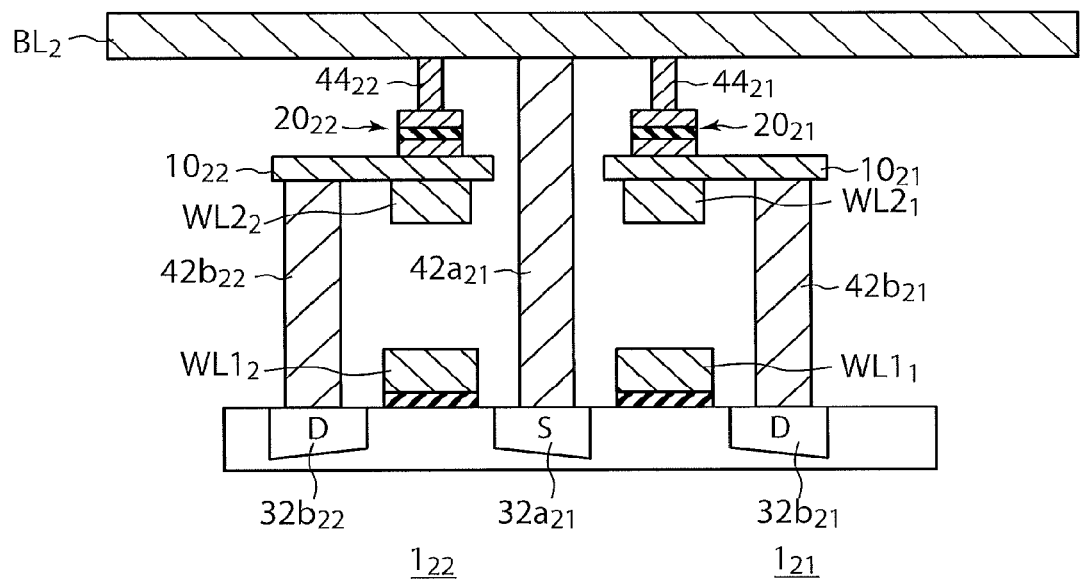
FIG. 9B is a cross-sectional view taken along the section line A-A defined in FIG. 9A.

FIG. 9A shows a fourth example of a layout in which memory cells 1 of the first embodiment are arranged in a 2×2 array. FIG. 9B shows a cross-section taken along the section line A-A defined in FIG. 9A.

The layout of the fourth example differs from the layout of the third example shown in FIGS. 7A and 7B, in that memory cells adjacent to each other in the transverse direction, such as the memory cell $1_{22}$ and the memory cell $1_{21}$, have the source $32a_{21}$ shared between the select transistors $32_{22}$ and $32_{21}$, and share a source electrode that is the source electrode $42a_{21}$.

In the fourth example, each magnetoresistive element $20_{ij}$ (i, j=1, 2) is circular in planar shape, and the area occupied by each magnetoresistive element $20_{ij}$(i, j=1, 2) is $1\times1F^2$, as in the third example. The gate width is assumed to be F as the minimum pitch width, and the intervals between adjacent memory cells are set at F both in the longitudinal direction. As can be seen from FIG. 9A, in this case, each memory cell is 2F in the size in the longitudinal direction, and is 2.5F in the size in the transverse direction. Accordingly, the area occupied by the memory cells is $2\times2.5F^2$ in the fourth example.

Although the layouts of the first through fourth examples have been described in conjunction with examples of memory cells of the first embodiment shown in FIG. 1A, memory cells of the second embodiments shown in FIG. 5 may be used. In that case, each diode 34 is provided in the middle of the corresponding electrode $44_{ij}$ (i, j=1, 2).

Next, the materials of the respective components constituting the magnetic memories of the first and second embodiments are described.

(Nonmagnetic Layer 10)

A metal formed with at least one element selected from the group consisting of Hf, Ta, W, Re, Ir, Pt, Au, Zr, Nb, Mo, Ru, Rh, Pd, Ag, Ti, V, Cr, Mn, Fe, Co, Ni, and Cu, for example, is used as the nonmagnetic layer 10. These metals are known to have a large spin Hall angle, or a high ratio of spin conductivity to electric conductivity. In other words, the nonmagnetic layer 10 is formed with at least one of Hf, Ta, W, Re, Ir, Pt, Au, Zr, Nb, Mo, Ru, Rh, Pd, Ag, Ti, V, Cr, Mn, Fe, Co, Ni, or Cu. As used herein, a phrase referring to "at least one of" a list of items refers to any combination of those items, including a single member. As an example, "at least one of: a, b, or c" is intended to cover a, b, c, a-b, a-c, b-c, and a-b-c."

Figure 11:
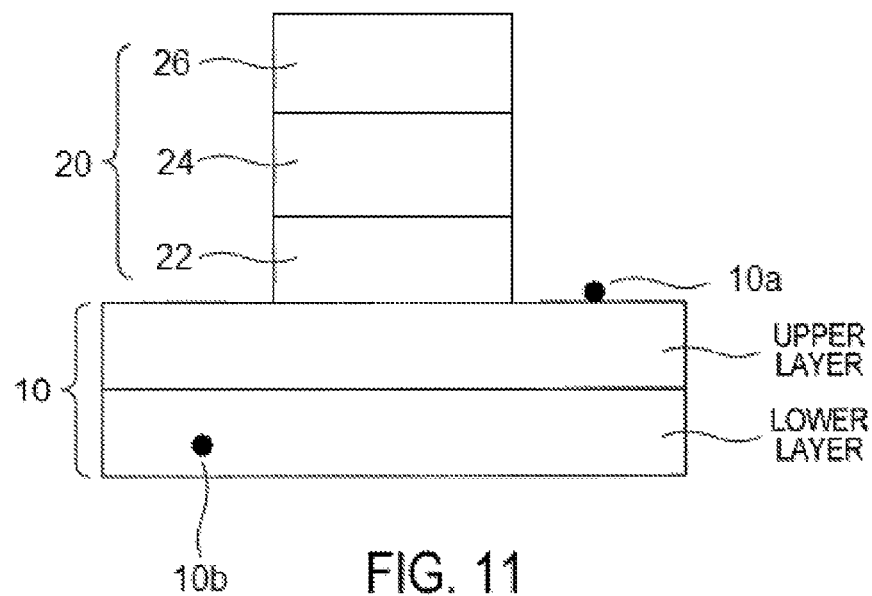
FIG. 11 is a cross-sectional view of the nonmagnetic layer.

Alternatively, the nonmagnetic layer 10 may be an alloy or a stack structure containing at least one element selected from the above group. The nonmagnetic layer 10 may be at least one alloy of HfTa, HfW, HfRe, HfZr, HfNb, HfMo, HfTi, HfV, HfCr, HfMn, TaRe, TaZr, TaNb, TaMo, TaTi, TaV, TaCr, TaMn, WRe, WZr, WNb, WMo, WTi, WV, WCr, WMn, ReZr, ReNb, ReMo, ReTi, ReV, ReCr, ReMn, IrPt, IrAu, IrRu, IrRh, IrPd, IrAg, IrFe, IrCo, IrNi, IrCu, PtAu, PtRu, PtRh, PtPd, PtAg, PtFePtCo, PtNi, PtCu, AuRu, AuRh, AuPd, AuAg, AuFe, AuCo, AuNi, or AuCu. The stack structure of the nonmagnetic layer 10 includes a structure for example as shown in FIG. 11.

The nonmagnetic layer 10 may be at least one stack structure of Hf/Ta, Hf/W, Hf/Re, Hf/Zr, Hf/Nb, Hf/Ti, Hf/V, Hf/Cr, Hf/Mn, Ta/Re, Ta/Zr, Ta/Nb, a/Ti, Ta/V, Ta/Cr, Ta/Mn, W/Re, W/Zr, W/Nb, W/Mo, W/Ti, W/V, W/Cr, W/Mn, Re/Zr, ReNb, Re/Mo, Re/Ti, Re/V, Re/Cr, Re/Mn, Ir/Pt, Ir/Au, Ir/Ru, Ir/Rh, Ir/Pd, Ir/Ag, Ir/Fe, Ir/Co, Ir/Ni, Ir/Cu, Pt/Au, Pt/Ru, Pt/Rh, Pt/Pd, Pt/Ag, Pt/Fe, Pt/Co, Pt/Ni, Pt/Cu, Au/Ru, Au/Rh, Au/Pd, Au/Ag, Au/Fe, Au/Co, Au/Ni, or Au/Cu. Here, the left side of each symbol "/" indicates the upper layer, and the right side indicates the lower layer (see FIG. 11). For example, Hf/Ta means a film stack having a Hf layer as the upper layer and a Ta layer as the lower layer. The stack structure of the nonmagnetic layer 10 includes a structure for example as shown in FIG. 11.

Also, to facilitate planarization of the nonmagnetic layer 10, at least one element selected from the group consisting of B, C, N, O, Si, P, and Bi may be added to the material of the nonmagnetic layer 10 so that the material of the nonmagnetic layer is turned into a microcrystalline material or an amorphous material. For example, the nonmagnetic layer 10 may be at least one of HfB, TaB, WB, ReB, IrB, PtB, AuB, ZrB, NbB, MoB, RuB, RhB, AgB, TiB, VB, CrB, MnB, CuB, HfBi, TaBi, WBi, ReBi, IrBi, PtBi, AuBi, ZrBi, NbBi, MoBi, RuBi, RhBi, AgBi, TiBi, VBi, CrBi, MnBi, or CuBi.

Also, the nonmagnetic layer 10 may be a stack structure formed with the above materials. For example, the nonmagnetic layer 10 may be at least one stack structure of HfB/Ta, HfB/W, HfB/Re, HfB/Zr, HfB/Nb, HfB/Mo, HfB/Ti, HfB/V, HfB/Cr, HfB/Mn, TaB/Re, TaB/Zr, TaB/Nb, TaB/Mo, TaB/Ti, TaB/V, TaB/Cr, TaB/Mn, WB/Re, WB/Zr, WB/Nb, WB/Mo, WB/Ti, WB/V, WB/Cr, WB/Mn, ReB/Zr, ReNb, ReB/Mo, ReB/Ti, ReB/V, ReB/Cr, ReB/Mn, IrB/Pt, IrB/Au, IrB/Ru, IrB/Rh, IrB/Pd, IrB/Ag, IrB/Fe, IrB/Co, IrB/Ni, IrB/Cu, PtB/Au, PtB/Ru, PtB/Rh, PtB/Pd, PtB/Ag, PtB/Fe, PtB/Co, PtB/Ni, PtB/Cu, AuB/Ru, AuB/Rh, AuB/Pd, AuB/Ag, AuB/Fe, AuB/Co, AuB/Ni, or AuB/Cu (see FIG. 11). The stack structure of the nonmagnetic layer 10 includes a structure for example as shown in FIG. 11.

Also, to prevent increases in the damping constant due to spin pumping, at least one element selected from the group consisting of Mg, Al, Sc, Zn, Ga, and N may be added to any of the above materials. For example, the nonmagnetic layer 10 may be at least one of HfMg, TaMg, WMg, ReMg, IrMg, PtMg, AuMg, ZrMg, NbMg, MoMg, RuMg, RhMg, AgMg, HfAl, TaAl, WAl, ReAl, IrAl, PtAl, AuAl, ZrAl, NbAl, MoAl, RuAl, RhAl, AgAl, HfMgAl, TaMgAl, WMgAl, ReMgAl, IrMgAl, PtMgAl, AuMgAl, ZrMgAl, NbMgAl, MoMgAl, RuMgAlM RhMgAl, AgMgAl, HfN, TaN, WN, ReN, IrN, PtN, AuN, ZrN, NbN, MoN, RuN, RhN, AgN, HfGa, TaGa, WGa, ReGa, IrGa, PtGa, AuGa, ZrGa, NbGa, MoGa, RuGa, RhGa, or AgGa.

Alternatively, the nonmagnetic layer 10 may be formed with a combination of the above materials. For example, the nonmagnetic layer 10 may be at least one of HfMgAlB, TaMgAlB, WMgAlB, ReMgAlB, IrMgAlB, PtMgAlB, AuMgAlB, ZrMgAlB, NbMgAlB, MoMgAlB, RuMgAlB, RhMgAlB, AgMgAlB, HfMgAlBN, TaMgAlBN, WMgAlBN, ReMgAlBN, IrMgAlBN, PtMgAlBN, AuMgAlBN, ZrMgAlBN, NBNMgAlBN, MoMgAlBN, RuMgAlBN, RhMgAlBN, or AgMgAlBN.

(Magnetic Layer 22)

A ferromagnetic material containing at least one element selected from the group consisting of Co, Fe, and Ni is used as the magnetic layer 22. Further, to control the lattice constant of the magnetic layer 22, at least one element selected from the group consisting of B, C, N, O, Si, and P may be added at a concentration of 25 atomic percent or lower. As such a material is used as the magnetic layer 22, a high spin polarizability can be achieved. Examples of such materials include CoFeB, CoFeSi, CoFeP, FeNiB, FeNiSi, and FeNiP. A film stack formed with ferromagnetic materials at different concentrations from those materials may also be used. Examples of such film stacks include CoFeB/CoFe, CoFeB/FeNiB, CoFeB film stacks with different compositions, and a CoFe film stack with different compositions.

(Magnetic Layer 26)

A magnetic material having a greater coercive force or a greater magnetic anisotropy energy than the magnetic layer 22 is used as the magnetic layer 26. As such a material is used, the resistance value of the magnetoresistive element can be obtained in a more stable manner. To achieve this, an alloy containing Mn and at least one element selected from the group consisting of Ir, Pt, Fe, and Rh, for example, is stacked on a ferromagnetic material containing at least one element selected from the group consisting of Co, Fe, and Ni. For example, the magnetization direction of a ferromagnetic material can be stabilized with a film stack formed with IrMn/CoFe, PtMn/CoFe, or FeMn/CoFe, for example.

(Nonmagnetic Intermediate Layer 24)

A known material for the tunnel barrier layer of an MTJ element is used as the nonmagnetic intermediate layer 24. For example, MgO, MgAlO, AlO, or the like is used. Alternatively, a nonmagnetic metal, such as Cu, Ag, or Au, may be used.

Third Embodiment

Figure 10:
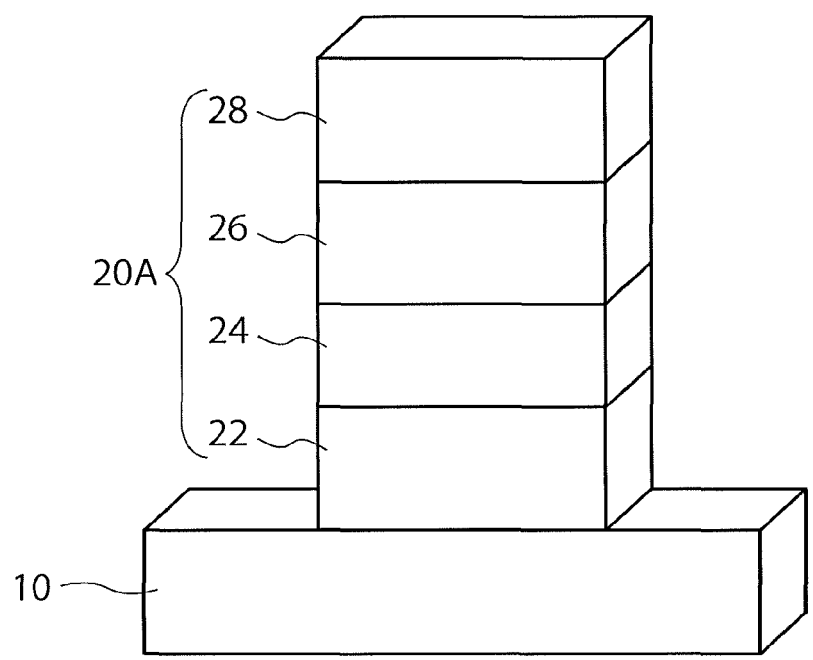
FIG. 10 is a perspective view of a magnetoresistive element according to a third embodiment.

Referring now to FIG. 10, a magnetic memory according to a third embodiment is described. The magnetic memory of the third embodiment is the same as the magnetic memory of the first embodiment shown in FIG. 1A or the second embodiment shown in FIG. 5, except that each memory cell includes a magnetoresistive element 20A shown in FIG. 10, instead of the magnetoresistive element 20.

The magnetoresistive element 20A is the same as the magnetoresistive element 20 shown in FIG. 1A, except that a magnetic layer 28 is further formed on the magnetic layer 26. That is, the magnetoresistive element 20A has a four-layer stack structure in which the magnetic layer 22 is formed between the nonmagnetic layer 10 and the magnetic layer 28, the nonmagnetic intermediate layer 24 is formed between the magnetic layer 22 and the magnetic layer 28, and the magnetic layer 26 is formed between the nonmagnetic intermediate layer 24 and the magnetic layer 28.

This magnetic layer 28 stabilizes (pins) the magnetization direction of the magnetic layer 26. An antiferromagnetic material, such as IrMn, PtMn, FeMn, or NiMn, is used as the magnetic layer 28.

In this case, a ferromagnetic material containing Co and Fe, for example, is used as the magnetic layer 26.

In a case where the memory cell 1A of the second embodiment is used in the third embodiment, the cathode of the diode 34 is connected to the magnetic layer 28.

In the third embodiment, a write operation and a read operation can also be performed with a simple cell configuration, as in the first or second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetic memory, comprising:
a first terminal and a second terminal;
a conductive member comprising a stack structure, the stack structure including a first layer and a second layer disposed on the first layer, the conductive member being electrically and directly connected to the first terminal and the second terminal, the first layer being nonmagnetic, the second layer being nonmagnetic and including boron, and the second layer including a region located between the first terminal and the second terminal; and
a magnetoresistive element disposed on a part of the region of the second layer, the magnetoresistive element comprising: a first magnetic layer; a second magnetic layer disposed between the part of the region of the second layer and the first magnetic layer; and a first nonmagnetic layer disposed between the first magnetic layer and the second magnetic layer.

2. The memory of claim 1, wherein the second layer is amorphous.

3. The memory of claim 1, wherein the second layer further comprises at least one selected from the group consisting of Ta, Pt, Au, Hf, Cu, and Re.

4. The memory of claim 1, wherein the conductive member comprises at least one selected from the group consisting of Hf, Ta, W, Re, Ir, Pt, Au, Zr, Nb, Mo, Ru, Rh, Pd, Ag, Ti, V, Cr, Mn, Fe, Co, Ni, and Cu.

5. A magnetic memory, comprising:
a first terminal and a second terminal;
a conductive member comprising a stack structure, the stack structure including a first layer and a second layer disposed on the first layer, the conductive member being electrically and directly connected to the first terminal and the second terminal, the first layer being nonmagnetic, the second layer being nonmagnetic and including nitrogen, and the second layer including a region located between the first terminal and the second terminal; and
a magnetoresistive element disposed on a part of the region of the second layer, the magnetoresistive element comprising: a first magnetic layer; a second magnetic layer disposed between the part of the region of the second layer and the first magnetic layer; and a first nonmagnetic layer disposed between the first magnetic layer and the second magnetic layer.

6. The memory of claim 5, wherein the second layer is amorphous.

7. The memory of claim 5, wherein the second layer further comprises at least one selected from the group consisting of Ta, Pt, Au, Hf, Cu, and Re.

8. The memory of claim 5, wherein the conductive member comprises at least one selected from the group consisting of Hf, Ta, W, Re, Ir, Pt, Au, Zr, Nb, Mo, Ru, Rh, Pd, Ag, Ti, V, Cr, Mn, Fe, Co, Ni, and Cu.

9. A magnetic memory, comprising:

a first terminal and a second terminal;

a conductive member comprising a stack structure, the stack structure including a first layer and a second layer disposed on the first layer, the conductive member being electrically and directly connected to the first terminal and the second terminal, the first layer being nonmagnetic, the second layer being nonmagnetic and including carbon, and the second layer including a region located between the first terminal and the second terminal; and a magnetoresistive element disposed on a part of the region of the second layer, the magnetoresistive element comprising: a first magnetic layer; a second magnetic layer disposed between the part of the region of the second layer and the first magnetic layer; and a first nonmagnetic layer disposed between the first magnetic layer and the second magnetic layer.

10. The memory of claim 9, wherein the second layer is amorphous.

11. The memory of claim 9, wherein the second layer further comprises at least one selected from the group consisting of Ta, Pt, Au, Hf, Cu, and Re.

12. The memory of claim 9, wherein the conductive member comprises at least one selected from the group consisting of Hf, Ta, W, Re, Ir, Pt, Au, Zr, Nb, Mo, Ru, Rh, Pd, Ag, Ti, V, Cr, Mn, Fe, Co, Ni, and Cu.

* * * * *